(12) United States Patent
Sato

(10) Patent No.: US 6,984,945 B2
(45) Date of Patent: Jan. 10, 2006

(54) LINEAR MOTOR APPARATUS

(75) Inventor: Mikio Sato, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 171 days.

(21) Appl. No.: 10/667,356

(22) Filed: Sep. 23, 2003

(65) Prior Publication Data

US 2004/0061385 A1    Apr. 1, 2004

(30) Foreign Application Priority Data

Sep. 27, 2002 (JP) .............................. 2002-284238

(51) Int. Cl.
*H02K 41/00* (2006.01)
(52) U.S. Cl. ..................................... 318/135
(58) Field of Classification Search .................. 310/12; 318/135; 355/53, 72
See application file for complete search history.

(56) References Cited

U.S. PATENT DOCUMENTS

| | | | |
|---|---|---|---|
| 4,749,921 A | * | 6/1988 | Chitayat ..................... 318/135 |
| 4,789,815 A | * | 12/1988 | Kobayashi et al. ......... 318/135 |
| 5,757,149 A | * | 5/1998 | Sato et al. .................. 318/135 |

FOREIGN PATENT DOCUMENTS

| | | |
|---|---|---|
| JP | 8-111998 | 4/1996 |
| JP | 6-284785 | 10/1997 |
| JP | 11-316607 | 11/1999 |
| JP | 11-341853 | 12/1999 |

* cited by examiner

*Primary Examiner*—Darren Schuberg
*Assistant Examiner*—Judson H. Jones
(74) *Attorney, Agent, or Firm*—Fitzpatrick, Cella, Harper & Scinto

(57) ABSTRACT

A linear motor apparatus which drives a mover of a linear motor in a stable manner, by using only information on change of relative position, without using an absolute value sensor. The apparatus has a coil array of plural phases of coils and a magnet relatively movable to the coil array, plural drivers, at least one of which being provided for each phase, to feed a current to all the same phase coils of the coil array, a sensor for measuring a change of relative position of the magnet moved by the current to the coil array, and a controller to determine the polarity of the current applied to the same phase coils based on the change of the relative position measured by the sensor, and apply a drive current to drive the magnet in a desired direction to the same phase coils.

2 Claims, 6 Drawing Sheets

LINEAR MOTOR APPARATUS

FIELD OF THE INVENTION

The present invention relates to a linear motor apparatus, and more particularly, to a linear motor apparatus utilized in an exposure apparatus.

BACKGROUND OF THE INVENTION

In a moving magnet type exciting linear motor, a mover is a magnet and a driving electric wire is provided on the stator side. In this arrangement, as the wire under no stress is not broken and heat generation is made on the stator side, cooling can be easily made by coolant or the like. Accordingly, this linear motor is used in various fields including a semiconductor fabrication apparatus requiring high reliability and accuracy.

In a semiconductor exposure apparatus, for the sake of improvement in throughput, it is necessary to increase the size of a substrate (wafer) on which the pattern of a reticle is transferred, and to improve an acceleration and maximum speed of the linear motor. From this background, as a longer stroke in comparison with the size of the mover is required, plural coil pairs are must be provided. If all the coil pairs are connected to the same current driver, a thrust can be generated, however, a coil outside of a magnetic field of the mover does not produce a thrust, but only causes a loss (heat generation) due to electric resistance of the coil. Thus the efficiency of the motor is extremely low.

To prevent this inconvenience, current drivers may be connected to the coil pairs of respective phases, such that a current command value of each current driver can be independently supplied to each connected coil pair, and a current cannot be fed through a coil outside of the magnetic field of the mover. This method requires current drivers and command value generation units corresponding to the number of the coil pairs. As the cost increases in proportion to the stroke, this method cannot be employed in the case of the long stroke.

As another method, the current drivers may be connected to the respective coils via relays such that a current is selectively fed through coils within the range of the magnetic field of the mover (See Patent Document 1: Japanese Published Unexamined Patent Application No. Hei 6-284785 and Patent Document 2: Japanese Published Unexamined Patent Application No. Hei 8-111998).

FIG. 3 illustrates the arrangement of a conventional linear motor driving circuit using relays. In FIG. 3, alphabet M denotes a mover magnet; reference numerals CAn−1, CAn and CAn+1, an A-phase stator coil array in the linear motor; CBn and CBn+1, a B-phase stator coil array in a linear motor; SAn−1, SAn and SAn+1, switches to the A-phase coils; SBn and SBn+1, switches to the B-phase coils; U, an absolute type ultrasonic sensor; DA, an A-phase driver; DB, a B-phase driver; and G, a controller. The interval between same-phase coils is 1.5 times of the period of the magnetic field of the mover magnet M.

Next, a driving method for moving the mover magnet M in a +x direction (leftward direction in FIG. 3) will be described. As to energizing of the stator coil, assuming that the mover magnet is positioned as shown in FIG. 3, to move the magnet in the +x direction, energizing of the A-phase is changed from the coil CAn to the coil An+1, and the controller G feeds a 2-phase drive current at a phase angle corresponding to the position.

In accordance with coil winding and connection of coil to the driver, upon change of energization to the same-phase coils (e.g., from the coil CAn to the coil CAn+1), a command current to the driver must be inverted. However, in this case, as disclosed in Patent Document 3(Japanese Published Unexamined Patent Application No. Hei 11-341853), the control accuracy of the linear motor is degraded, and the load on the driver is increased. Accordingly, as disclosed in the Patent Document 3, it is preferable to connect the same-phase coils to the same-phase driver such that the polarity is inverted by each of same-phase coils. In such connection, in the position in FIG. 3, the drive current command value at a phase angle of 180° is supplied to the coil CAn+1 and the drive current command value at a phase angle of 90° is supplied to the coil CBn.

In an exposure apparatus requiring accuracy on the order of nanometer and a several hundred mm moving stroke, a laser interferometer is often used for position measurement. This high-accuracy and long-stroke measurement means generally is not an absolute type means but an incremental type measurement means to detect relative position information. Accordingly, to obtain absolute position information, position data must be initialized (calibrated). Generally, as the initialization of position data, the mover is moved to a particular position (a thrusted position, attachment position of a photo interruptive switch for initial position detection, or the like) (this movement is referred to as initialization driving), and the measurement value is rewritten with a desired value there. However, in this initialization driving, the incremental type sensor including an interferometer cannot be employed. Patent Document 4(Japanese Published Unexamined Patent Application No. Hei 11-316607) discloses initialization of an interferometer for initialization driving using an absolute sensor with accuracy lower than an incremental sensor such as a ultrasonic sensor.

SUMMARY OF THE INVENTION

However, in the case of measurement of a moving part which moves in a long stroke by an absolute sensor, as the absolute sensor is particularly influenced with disturbance from an external environment in comparison with an interferometer or a linear encoder, the absolute sensor may malfunction according to circumstances. To realize stable position control, it is important to move the mover and to reliably initialize the position information of the moving part, by only using relative position change information, without absolute sensor.

To solve the above problem, a linear motor apparatus according to the present invention, having a coil array of plural phases of coils and a magnet relatively movable to the coil array, mainly has: plural drivers, at least one of which being provided for each phase, to feed a current to all the same phase coils of the coil array; measurement means for measuring a change of relative position of the magnet moved by the current to the coil array; and a controller to determine the polarity of the current applied to the same phase coils based on the change of the relative position measured by the measurement means, and apply a drive current to drive the magnet in a desired direction to the same phase coils.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

<First Embodiment>

Figure 1:
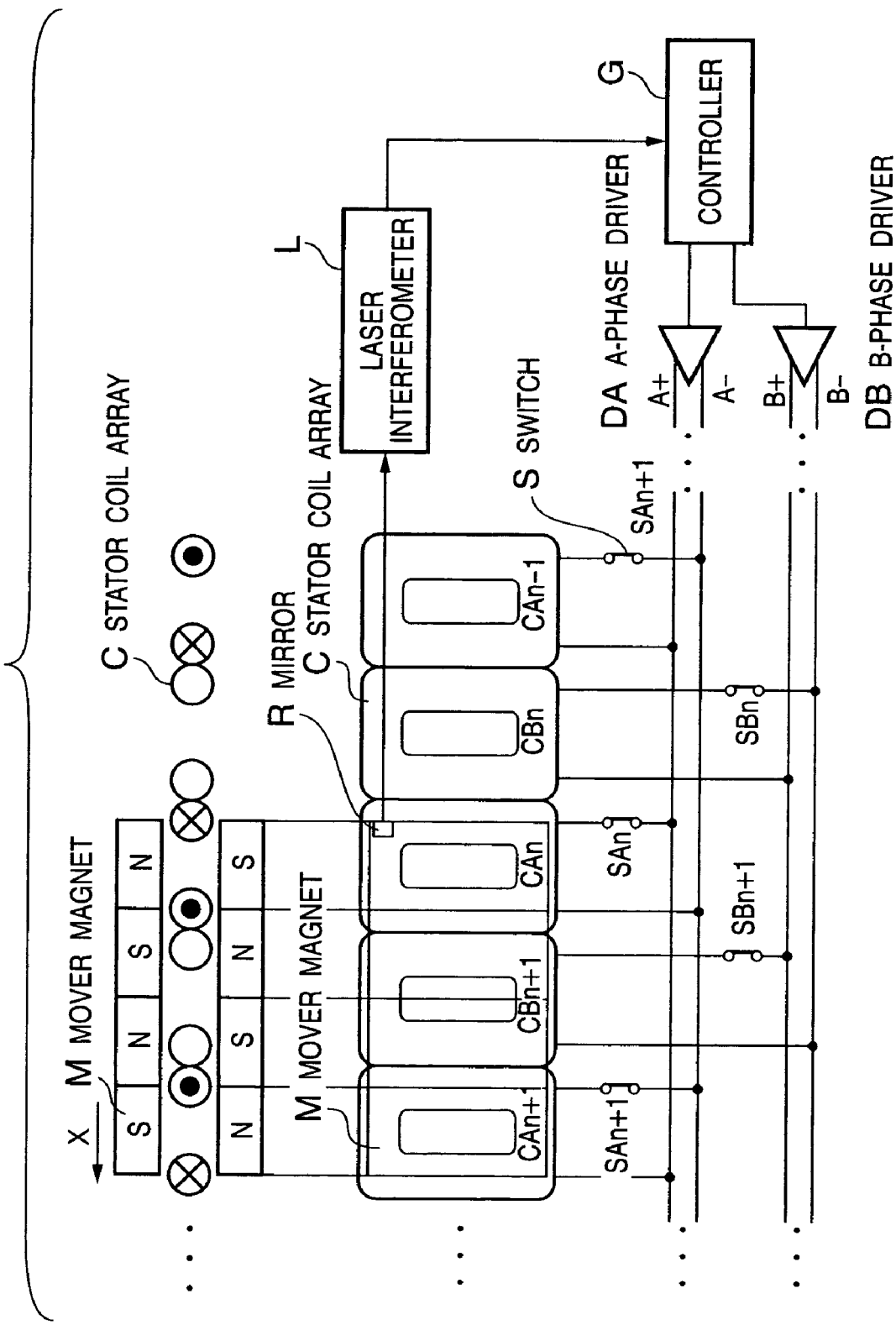
FIG. 1 is a block diagram showing a linear motor driving circuit according to a first embodiment of the present invention.

FIG. 1 shows the construction of a linear motor driving circuit according to a first embodiment of the present invention. In FIG. 1, alphabet M denotes a mover magnet; CAn−1, CAn and CAn+1, an A-phase coil array; CBn and CBn+1, a B-phase coil array; and SAn−1, SAn, SAn+1, SBn and SBn+1, switches to the respective A-phase and B-phase coils.

Further, alphabet L denotes an incremental laser interferometer; R, a reflecting mirror; DA, an A-phase driver; DB, a B-phase driver; and G, a controller. The interval between the respective same-phase coils is 1.5 times (integer+0.5) of the period of the magnetic field of the mover magnet M. Further, as disclosed in JPA Hei 11-341853, the respective coils are connected to the switches SA and SB such that the polarity is inverted by same-phase coil and at least one of the same-phase coils can be selectively connected to the same-phase driver (DA or DB). Further, for all phase driving, i.e., driving of all the A-phase and B-phase stator coils as a feature of the present invention, all the same-phase coils can be simultaneously energized by the A-phase and B-phase drivers.

Figure 2:
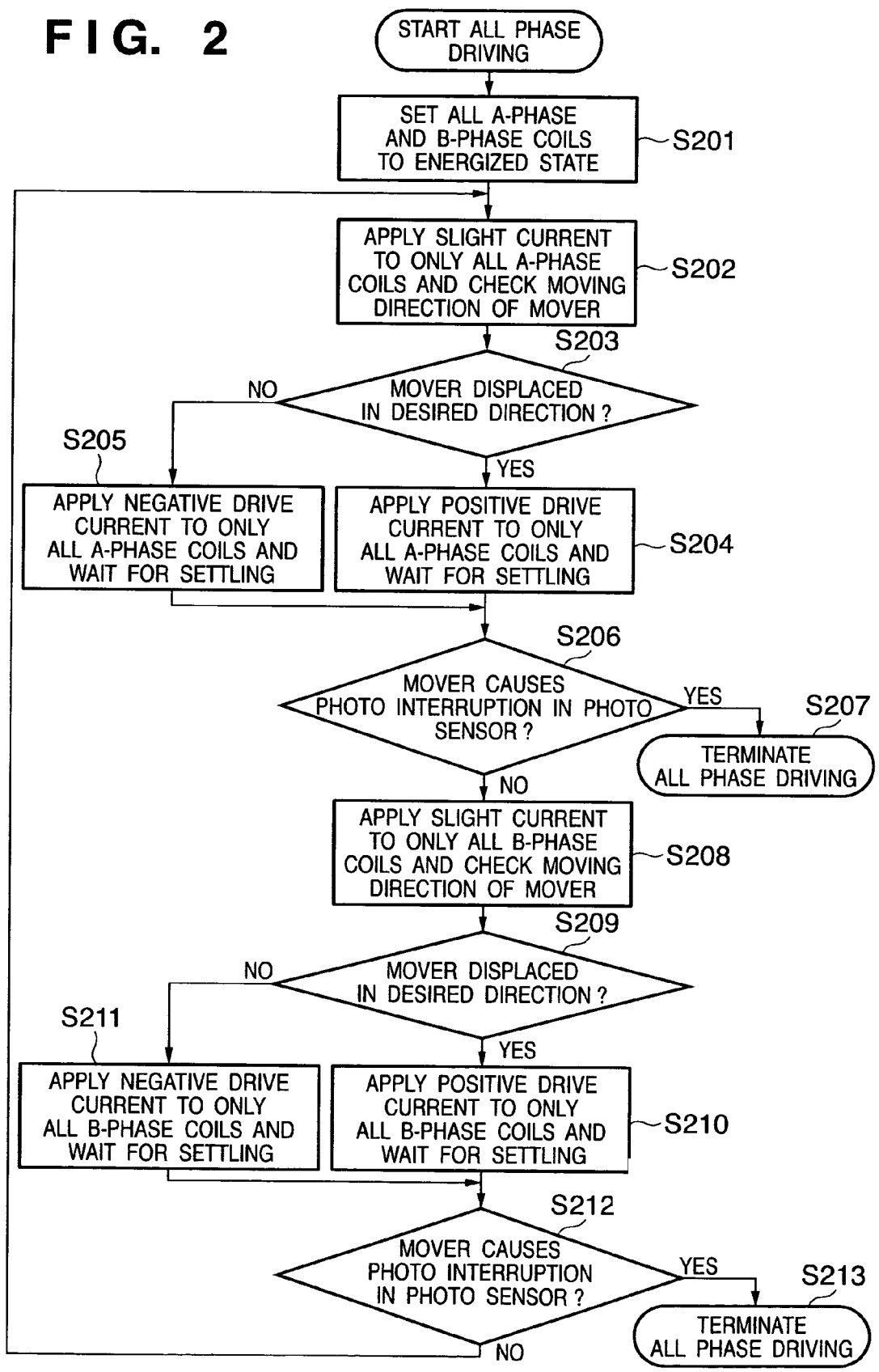
FIG. 2 is a flowchart showing the flow of processing in the driving circuit according to the first embodiment.
Figure 3:
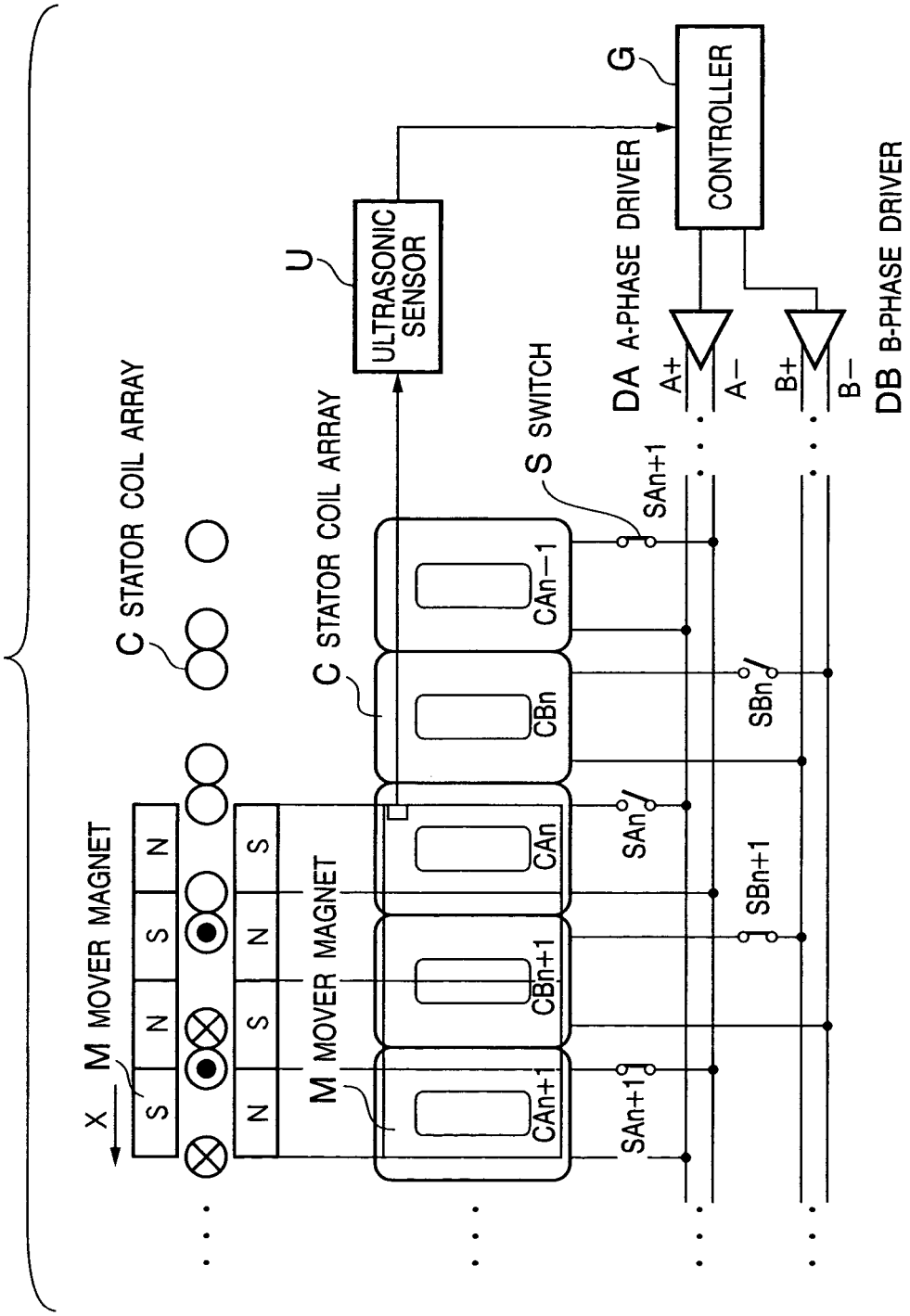
FIG. 3 is a block diagram showing the conventional linear motor driving circuit.

Upon starting of the apparatus with a linear motor as a driving source, the laser interferometer L cannot detect the absolute position of the mover magnet M to the stator coil array but only can detect relative displacement information between the stator coil array and the mover magnet. In this status, for initialization to set an original position of the linear motor by using the result of detection by the laser interferometer L, the mover magnet M is moved by the all phase driving to an original position where a photo interruptive sensor (not shown) is provided. The flow of processing in the driving circuit for the movement is as shown in the flowchart of FIG. 2. Hereinbelow, the processing will be more specifically described.

First, at step S201, the controller G controls the respective switches (SAn . . . , SBn . . . ) to set all the A-phase and B-phase coils to an energized state. Next, at step S202, to slightly move the mover magnet M, a slight current in a positive direction is applied to all the A-phase coils, and at the same time, the direction of relative very small position change of the mover magnet M to the stator coils (it is not necessary to grasp the absolute position) is detected by the laser interferometer L.

At step S203, the moving direction is determined, a current direction (current polarity) is determined to move the mover magnet M toward the photo interruptive sensor only with the A-phase coil array. If the mover magnet M has been displaced in the desired direction (S203-Yes), the process proceeds to step S204, at which a positive drive current is applied to only all the A-phase coils, then the process waits until the mover magnet M is settled. On the other hand, if it is determined at step S203 that the mover magnet M has not been displaced in the desired position, i.e., the magnet has been displaced in an opposite direction (S203-No), the process proceeds to step S205, at which a negative drive current is applied to only all the A-phase coils so as to invert the direction of displacement, then the process waits until the mover magnet M is settled.

Figure 4A:
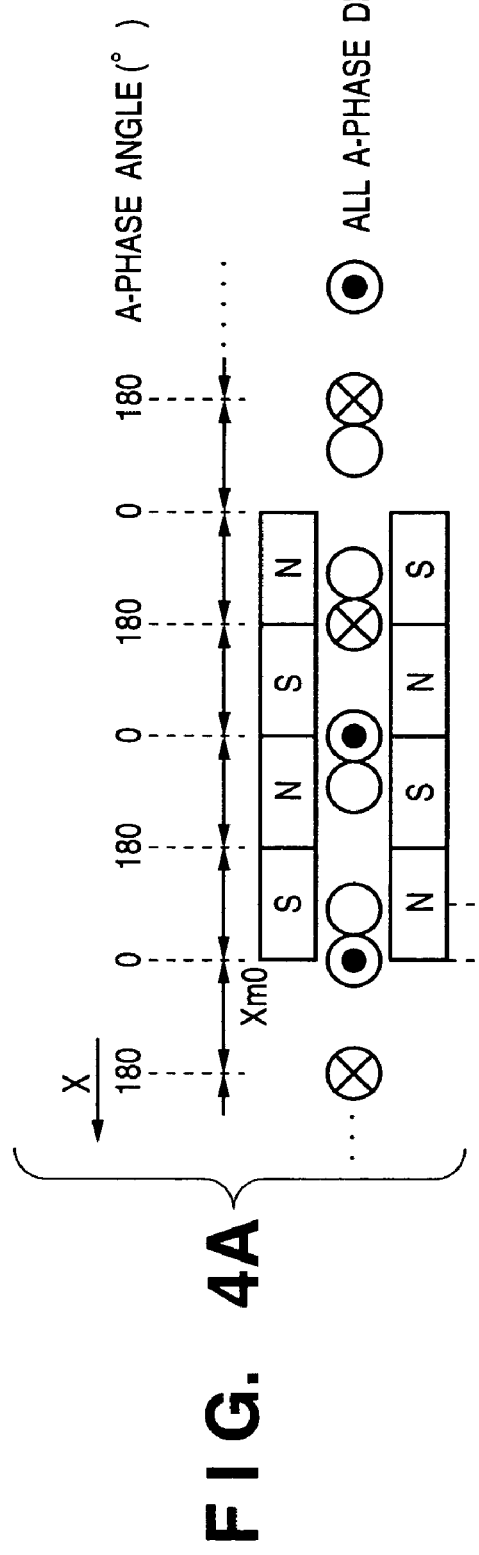
FIGS. 4A and 4B are explanatory views showing stop positions of a mover in all A-phase and B-phase driving.

Then the mover magnet M is withdrawn to any of phase angle positions at phase angle of 180° and phase angle of 0° and stopped (FIG. 4A). In the figure, a left end Xm0 of the mover magnet is settled in the position at the phase angle of 0°. As the phase difference between the A-phase and the B-phase is 90°, the stop position of the mover magnet M corresponds to the phase angle of 90° or −90° in the B-phase (this phase angle position corresponds to a phase angle position where a maximum thrust force can be produced in the +X direction or −x direction in the B-phase so as to form a maximum magnetic field from the relation with the mover magnet M).

Figure 4B:
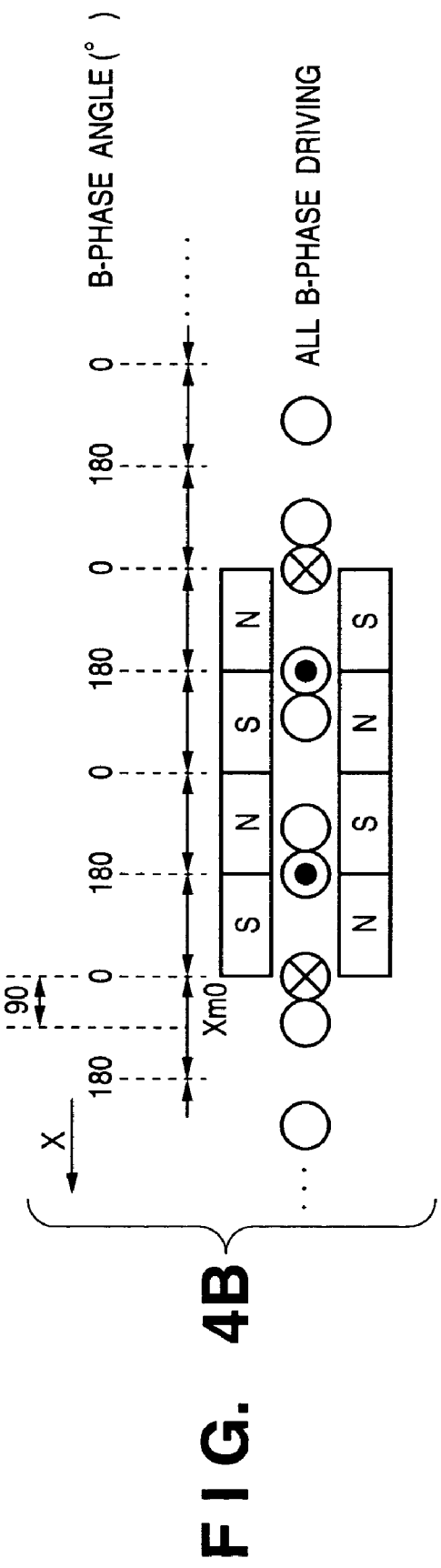

FIG. 4A schematically shows a direction in which the mover magnet M is withdrawn in the case of driving of the mover magnet M by application of positive current to all the A-phase coils (all A-phase driving) and the status of stoppage after the withdrawal. FIG. 4B schematically shows a direction in which the mover magnet M is withdrawn in the case of driving of the mover magnet M by application of positive current to all the B-phase coils (all B-phase driving) and the status of stoppage after the withdrawal. The position of the end Xm0 of the mover magnet M varies either of a phase angle of 180° or the phase angle of 0° in correspondence with the initial position of the mover magnet M.

Returning to FIG. 2, at step S206, it is determined whether or not the settled mover magnet M causes photo interruption in the photo sensor. If the magnet causes photo interruption in the photo sensor (S206-Yes), the process proceeds to step S207, at which the all phase driving is terminated. The position of the mover magnet is initialized by photo interruption in the photo sensor. That is, the original point of the linear motor is obtained by the above steps.

If it is determined at step S206 that the mover magnet M does not cause photo interruption in the photo sensor (S206-No), the process proceeds to step S208, to perform processing similar to that in the A-phase in the B-phase.

At step S208, the drive command value (positive drive current) to all the A-phase coils is set to zero, then as in the case of the A-phase, a slight current in the positive direction is applied to all the B-phase stator coils to slightly move the mover magnet M, and at the same time, the direction of relative position change of the mover magnet M is detected by the laser interferometer L.

At step S209, the moving direction is determined, and the current direction (current polarity) is determined to move the mover magnet M toward the photo interruptive sensor only with the B-phase coil array. If the mover magnet M has been displaced in the desired direction (S209-Yes), the process proceeds to step S210, at which a positive drive current is applied to only all the B-phase coils, then the process waits until the mover magnet M is settled. On the other hand, if it is determined at step S209 that the mover magnet M has not been displaced in the desired position, i.e., the magnet has been displaced in an opposite direction (S209-No), the process proceeds to step S211, at which a negative drive current is applied to only all the B-phase coils so as to invert the direction of displacement, then the process waits until the mover magnet M is settled. Then the mover magnet M is withdrawn to any of phase angle positions at phase angle of 180° and phase angle of 0° and stopped (See FIG. 4B).

At step S212, if it is determined that the mover magnet M causes photo interruption in the photo sensor (S212-Yes), the process proceeds to step S213, at which the all phase driving is terminated.

If it is determined at step S212 that the mover magnet M does not cause photo interruption in the photo sensor (S212-No), the process returns to step S202, to repeat the processing in the A-phase.

This operation is repeated until photo interruption is caused (the absolute position can be determined upon photo interruption) at the photo-interruptive switch (not shown), thereby the mover magnet M can be moved to the photo-interruption position in the photo sensor for detection of the original point position of the mover magnet, by utilizing information on relative position change of the mover magnet M to the stator coils, without detection of the absolute position of the mover magnet M. Thereafter, the position information of the laser interferometer is initialized and the 2-phase driving while selecting desired A-phase or B-phase coils is performed in correspondence with the position of the mover magnet M.

As described above, according to the present embodiment, the mover can be moved in a stable manner and the position information of the moving part can be reliably initialized by using only the relative position change information without detection of absolute position by absolute value sensor.

<Second Embodiment>

Figure 5:
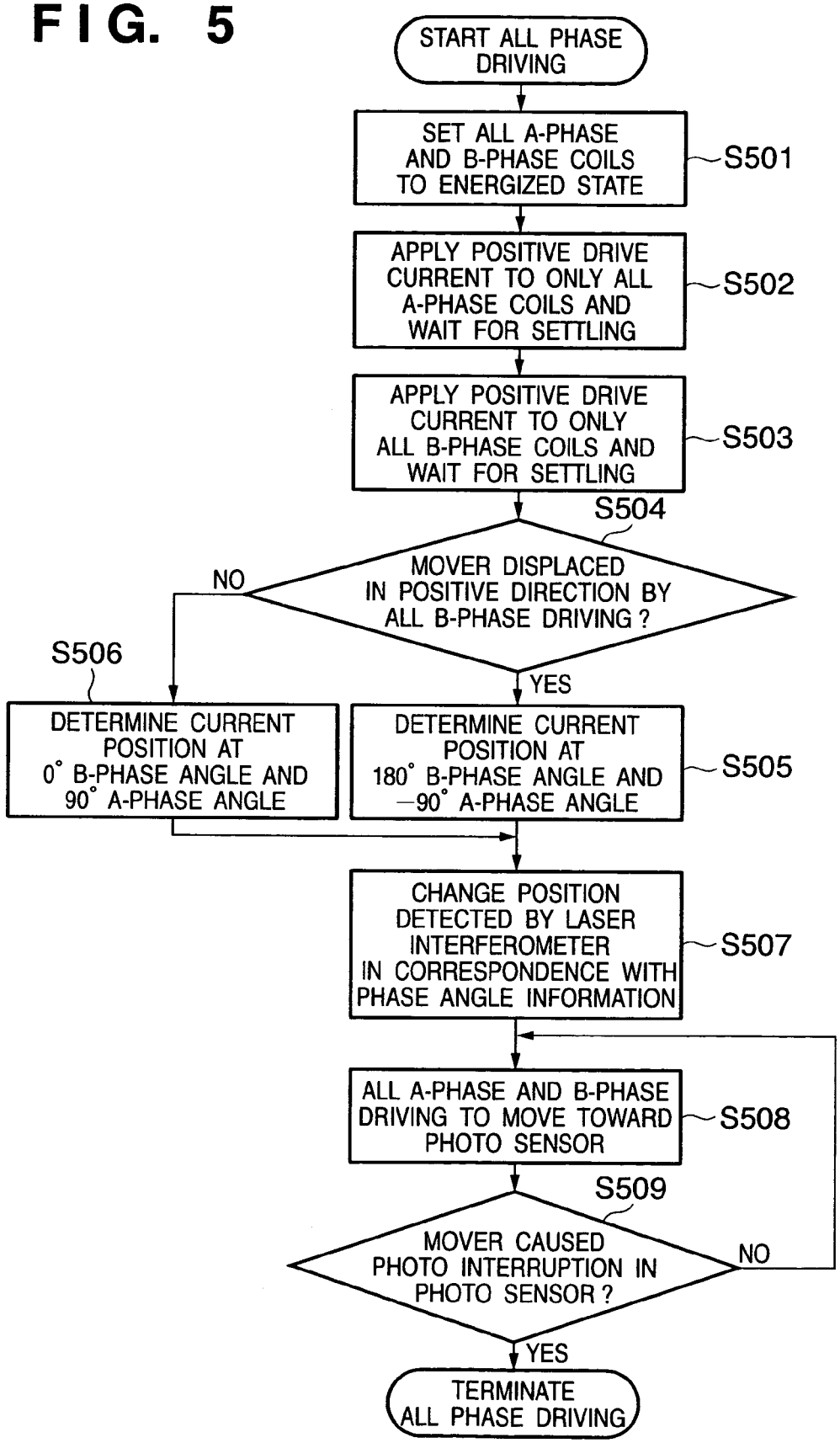
FIG. 5 is a flowchart showing the flow of processing in the driving circuit according to a second embodiment of the present invention.

In the linear motor, when the drive current is sequentially applied to all the A-phase and B-phase coils of the stator coil array, the A-phase and B-phase angles are determined based on the direction of relative displacement (without determination of absolute position). In the second embodiment, the position of the mover magnet is initialized with the 2 phase driving based on the phase angle information. As the arrangement of the mover magnet and the stator coil array is the same as that in FIG. 1 described in the first embodiment, the explanation of the arrangement will be omitted here. FIG. 5 is a flowchart showing the flow of processing according to the second embodiment.

First, as in the case of the first embodiment (FIG. 1), the respective coils of the stator coil array are connected to the switches (SAn . . . , SBn . . . ) such that the polarity is inverted by each same-phase coil. Further, upon starting of the apparatus, the laser interferometer L cannot detect the absolute position of the mover magnet M to the stator coil array but only can detect relative displacement information between the stator coil array and the mover magnet.

First, at step S501, the controller G controls the respective switches (SAn . . . , SBn . . . ) to set all the A-phase and B-phase coils to an energized state. Then the process proceeds to step S502, at which a positive drive current is applied to all the A-phase coils, and the process waits until the mover magnet M is settled. Thereafter, at step S503, the drive current to all the A-phase coils is set to zero, and a positive drive current is applied to all the B-phase coils to drive the mover magnet M, and the process waits until the magnet is settled.

At step S504, the moving direction of the mover magnet M is detected by the laser interferometer L, and the relative position change of the mover magnet M to application of the positive drive current to all the B-phase coils is detected. If it is determined based on the result of detection that the mover magnet M has been displaced in a positive direction (S504-Yes), the process proceeds to step S505. On the other hand, if it is determined that the mover magnet M has been displaced in a negative position (S504-No), the process proceeds to step S506.

At steps S505 and S506, the A-phase and B-phase angles in the current position are set so as to detect the initial position of the mover magnet M. As to the setting of the phase angles, for example, as shown in FIG. 4, since the mover magnet M is withdrawn to any of the phase angle of 180° and the phase angle of 0° and stopped, and the phase difference between the A-phase and the B-phase is 90°, the A-phase and B-phase angles in the stop status are set as follows.

Position change is in the positive direction (corresponding to step S505)

A-phase angle=−90°, B-phase angle=180°

Position change is in the negative direction (corresponding to step S506)

A-phase angle=90°, B-phase angle=0°

At step S507, the current position information detected by the laser interferometer L is brought into correspondence with the above phase angles as the pseudo original point position on the stator coil array, thus the initialization is performed. The phase angle information is obtained with lower accuracy in comparison with that of the laser interferometer, however, the phase angles can be determined with sufficient accuracy to perform the temporary initialization using the phase angle information, so as to move the mover magnet M by the all 2-phase driving (by application of the drive current to all the A-phase and B-phase stator coils) in the positive or negative direction to the photo interruptive sensor.

Then at step S508, the mover magnet M is moved by the all 2-phase driving to the photo interruptive sensor. At step S509, if it is determined that the mover magnet M has caused photo interruption in the photo sensor (S509-Yes), the position information of the laser interferometer is effectively initialized, and the 2-phase driving while selecting desired A-phase and B-phase coils is performed in correspondence with the position of the mover magnet M.

As described above, according to the present embodiment, the mover can be moved in a stable manner and the position information of the moving part can be reliably initialized by using only the relative position change information without detection of absolute position by absolute value sensor.

Note that in the above first and second embodiments, the 2-phase (A-phase and B-phase) drive type linear motor is employed, however, similar advantages can be obtained in use of 3-phase or 4-phase drive liner motor. Further, as described in the embodiments, the above processing is widely effective not only in driving for initialization but also in drive control of a mover of multi-phase drive linear motor using an incremental sensor which cannot detect an absolute position.

<Third Embodiment (Exposure Apparatus)>

Figure 6:
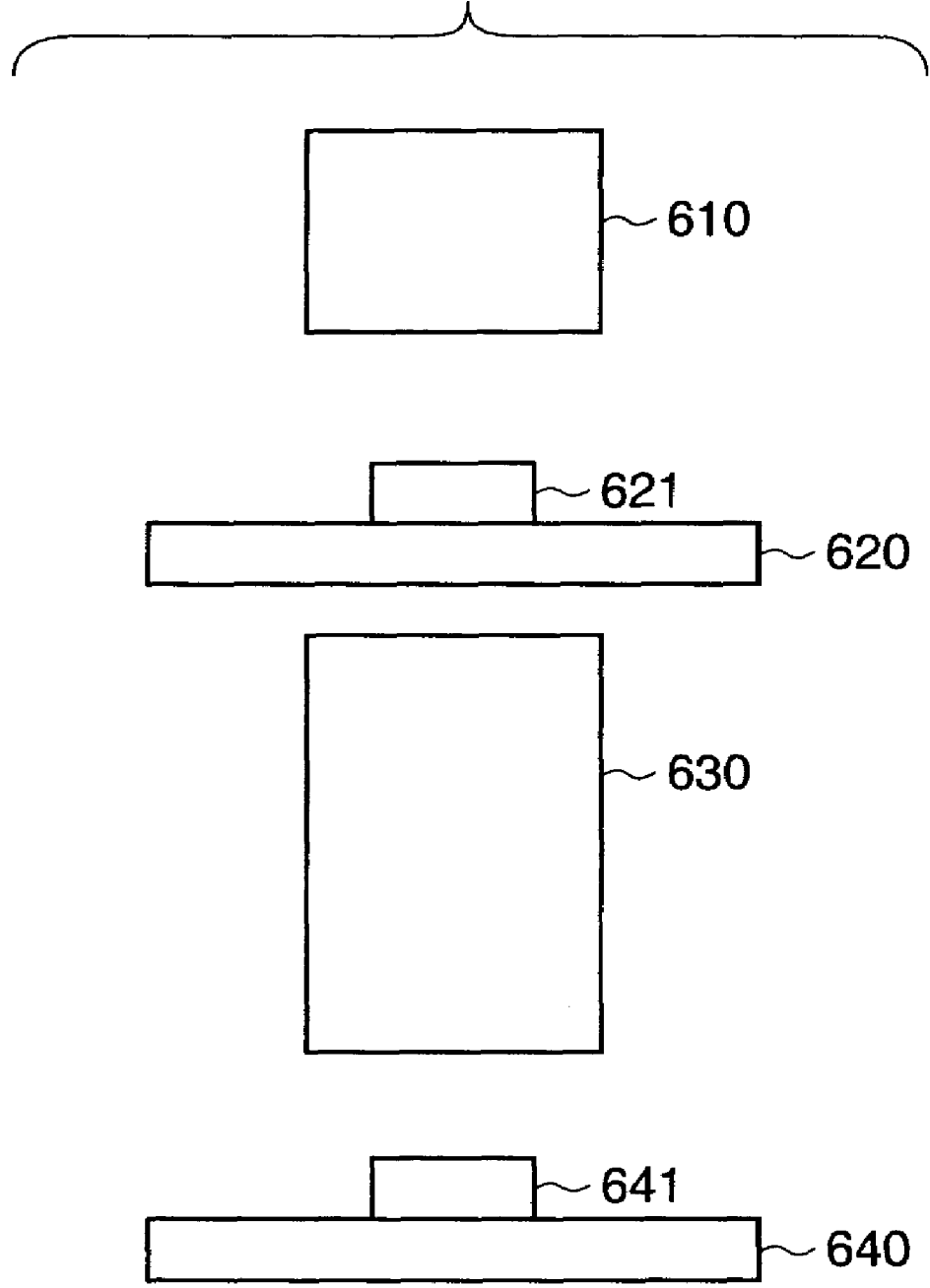
FIG. 6 is a schematic diagram showing an arrangement of an exposure apparatus to which a linear motor using the linear motor driving circuit according to the first or second embodiment is applied.

FIG. 6 is a schematic diagram showing an arrangement of an exposure apparatus to which a positioning device having a linear motor driven by the above-described linear motor driving circuit as a driving source is applied. The exposure apparatus irradiates a reticle(or mask) 621 held on a reticle stage 620 with an illumination optical system 610, projects a pattern of the reticle 621 via a projection optical system 630 to a substrate (wafer) 641 on a substrate stage (wafer stage) 640 and exposes the substrate 641. The exposed substrate 641, in which a photosensitive layer on the substrate is developed, is processed for fabrication of a semiconductor device at a well-known semiconductor fabrication process. Note that the positioning device having the linear motor, driven by the liner motor driving circuit described in the first and second embodiments as a driving source, is applied to the reticle stage 620 and/or the substrate stage 640.

Accordingly, another aspect of the present invention is that the invention relates to an exposure apparatus which performs positioning of a target material by the above-described positioning device to perform an exposure operation.

Further, another aspect of the present invention is that the invention relates to a device fabrication method including a process of transferring a pattern onto a substrate and a process of developing the substrate by the above-described exposure apparatus.

As described above, according to the present invention, the mover can be moved in a stable manner and the position information of the moving part can be reliably initialized by using only the relative position change information without detection of absolute position by absolute value sensor.

As many apparently widely different embodiments of the present invention can be made without departing from the spirit and scope thereof, it is to be understood that the invention is not limited to the specific embodiments thereof except as defined in the appended claims.

What is claimed is:

1. The linear motor apparatus having a coil array of plural phases of coils and a magnet relatively movable to said coil array, comprising:

plural drivers, at least one of which being provided for each phase, to feed a polarity determination current to all the same phase coils of said coil array;

measurement means for measuring a change of relative position of said magnet moved by the polarity determination current to said coil array; and a controller to determine the polarity of a drive current to be applied to the same phase coils based on the change of the relative position measured by said measurement means, and apply the drive current to drive said magnet in a desired direction to the same phase coils, wherein after first settling of said magnet by a first polarity determination current to first same-phase coils, said measurement means measures the position of second settling of said magnet driven by a second polarity determination current to second same-phase coils, and wherein said controller sets a first phase angle to said first same-phase coils and a second phase angle to said second same-phase coils as phase angle information to specify a current position of said magnet, based on the position of the second settling measured by said measurement means.

2. The linear motor apparatus according to claim 1, wherein said controller applies the drive current to drive said magnet in a predetermined direction to said first same-phase coils or said second same-phase coils, based on said phase angle information.

* * * * *

UNITED STATES PATENT AND TRADEMARK OFFICE
CERTIFICATE OF CORRECTION

| | | |
|---|---|---|
| PATENT NO. | : 6,984,945 B2 | Page 1 of 1 |
| APPLICATION NO. | : 10/667356 | |
| DATED | : January 10, 2006 | |
| INVENTOR(S) | : Mikio Sato | |

It is certified that error appears in the above-identified patent and that said Letters Patent is hereby corrected as shown below:

<u>TITLE PAGE AT ITEM [56] RC:</u>
Foreign Patent Documents, "JP 6-284785 10/1997" should read
--JP 6-284785 10/1994--.

Signed and Sealed this

Eleventh Day of July, 2006

JON W. DUDAS
*Director of the United States Patent and Trademark Office*